US012573363B2

(12) United States Patent
Küppers et al.

(10) Patent No.: US 12,573,363 B2
(45) Date of Patent: Mar. 10, 2026

(54) METHOD FOR MASKING UNDESIRABLE DISTURBING NOISES AND VEHICLE

(71) Applicant: MERCEDES-BENZ GROUP AG,
Stuttgart (DE)

(72) Inventors: Thomas Küppers, Altdorf (DE); Dirk Lieske, Korntal-Munich (DE);
Alexander Treiber, Holzgerlingen (DE)

(73) Assignee: MERCEDES-BENZ GROUP AG,
Stuttgart (DE)

( * ) Notice: Subject to any disclaimer, the term of this patent is extended or adjusted under 35 U.S.C. 154(b) by 202 days.

(21) Appl. No.: 18/682,579

(22) PCT Filed: Jul. 22, 2022

(86) PCT No.: PCT/EP2022/070657
§ 371 (c)(1),
(2) Date: Feb. 9, 2024

(87) PCT Pub. No.: WO2023/016779
PCT Pub. Date: Feb. 16, 2023

(65) Prior Publication Data
US 2024/0282287 A1    Aug. 22, 2024

(30) Foreign Application Priority Data

Aug. 10, 2021    (DE) ..................... 10 2021 004 108.9

(51) Int. Cl.
*G10K 11/16* (2006.01)
*G10K 11/175* (2006.01)
(Continued)

(52) U.S. Cl.
CPC ......... *G10K 11/1752* (2020.05); *H03G 3/301* (2013.01); *H04R 3/04* (2013.01); *H03G 2201/103* (2013.01); *H04R 2499/13* (2013.01)

(58) Field of Classification Search
CPC .............. G10K 11/1752; H03G 3/301; H03G 2201/103; H04R 3/04; H04R 2499/13
(Continued)

(56) References Cited

U.S. PATENT DOCUMENTS

| | | | |
|---|---|---|---|
| 10,290,295 B2 | 5/2019 | Kotegawa et al. | |
| 10,629,182 B1 | 4/2020 | Layton et al. | |
| 2021/0197667 A1 | 7/2021 | Winton et al. | |

FOREIGN PATENT DOCUMENTS

| | | |
|---|---|---|
| DE | 102017129097 A1 | 6/2018 |
| DE | 102020004974 A1 | 11/2020 |

(Continued)

OTHER PUBLICATIONS

Office Action dated Apr. 8, 2025 in related/corresponding JP Application No. 2024-506826.

(Continued)

*Primary Examiner* — Ammar T Hamid
(74) *Attorney, Agent, or Firm* — PATENT PORTFOLIO BUILDERS PLLC

(57)    ABSTRACT

Synthetic noises are generated to mask undesirable disturbing noises arising during the operation of a vehicle. The synthetic noise is generated from an unmodulated synthetic noise to adjust a desired sound characteristic by multiplication with at least one filter and/or amplifier which is dependent on a vehicle parameter. A pitch of all acoustic signals of which the modulated synthetic noise is composed is kept constant during an emission of the modulated synthetic noise. The unmodulated synthetic noise is designed as 1/f noise, and is pre-modulated by at least one static filter before being modulated by the at least one filter and/or amplifier which is dependent on the vehicle parameter.

18 Claims, 2 Drawing Sheets

Figure 1:
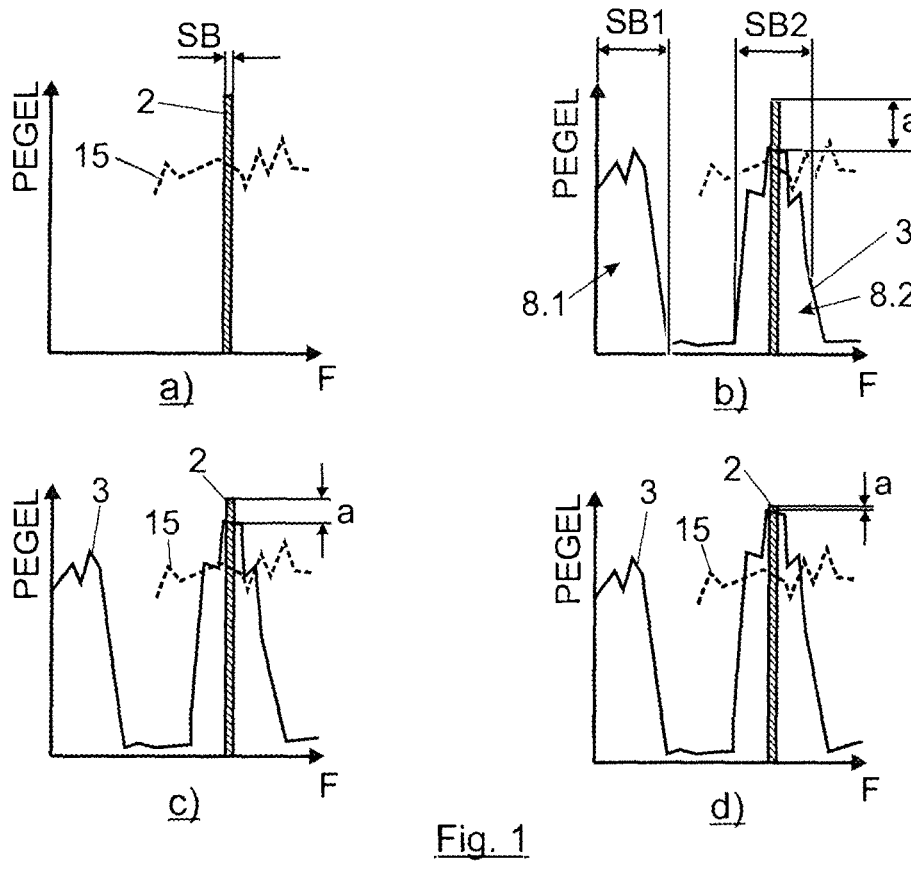

(51) Int. Cl.
   *H03G 3/30*           (2006.01)
   *H04R 3/04*           (2006.01)
(58) Field of Classification Search
   USPC ................................................... 381/73.1, 86
   See application file for complete search history.

(56) References Cited

FOREIGN PATENT DOCUMENTS

| | | | | | |
|---|---|---|---|---|---|
| EP | 3514790 | A1 | | 7/2019 | |
| EP | 3757986 | A1 | | 12/2020 | |
| JP | 2004096664 | A | * | 3/2004 | |
| JP | 2013198065 | A | * | 9/2013 | ............... H04S 7/30 |
| JP | 2019086593 | A | * | 6/2019 | ............... H04R 3/12 |
| JP | 2019124931 | A | * | 7/2019 | ......... B60R 16/0373 |

OTHER PUBLICATIONS

International Search Report and Written Opinion mailed Nov. 7, 2022 in related/corresponding International Application No. PCT/EP2022/070657.
Office Action created Feb. 25, 2022 in related/corresponding DE Application No. 10 2021 004 108.9.

* cited by examiner

METHOD FOR MASKING UNDESIRABLE DISTURBING NOISES AND VEHICLE

BACKGROUND AND SUMMARY OF THE INVENTION

Exemplary embodiments of the invention relate to a method of using synthetic noises for masking undesirable disturbing noises arising during the operation of a vehicle and to a vehicle for carrying out the method.

Vehicles emit a wide range of different noises during their operation. Some of these noises, for example a crisp motor or exhaust sound, are perceived as pleasant, while other noises such as rattling, clattering, buzzing, or a dragging fan belt are perceived as unpleasant. In particular for electric vehicles, the noises emitted by the vehicle play an important role in comfort when using the vehicle and in the safety of traffic participants. Because electric vehicles are mostly quieter compared to a vehicle with an internal combustion engine, traffic participants often find it difficult to notice electric vehicles. Methods and devices for generating synthetic vehicle noises are already known from the prior art. By means of such a synthetic vehicle noise, an acceleration of the corresponding vehicle is, for example, emphasized, whereby, on the one hand, other traffic participants are warned of the electric vehicle and, on the other, by generating a particularly futuristic and pleasant engine sound, a degree of comfort for the person driving the electric vehicle is increased.

Typically, electric motors emit medium and high-frequency vibrations, which can only be partially damped by typical noise vibration harshness (NVH) measures. The noises generated by the vibration are quiet in principle, but can be clearly heard due to their tonality and the correlation of the pitch with the rotational speed of the electric motor or with a vehicle driving speed.

For example, a method and device for generating a synthetic noise to emphasize an acceleration of a vehicle is known from EP 3 514 790 A1. Such a noise, which is connected to the acceleration of the vehicle, is only insufficiently suitable for masking noises that are not dependent on the acceleration of the vehicle, however.

By contrast, DE 10 2020 004 974 A1 discloses a method for masking undesirable noises generated by a drive train of a vehicle, which method is suitable for masking noises that are not connected with an acceleration of the vehicle. According to the method disclosed in the document, an unmodulated synthetic noise is multiplied via multiplication with a filter dependent on a vehicle parameter and an amplifier dependent on a vehicle parameter, and thereby modulated to generate a particularly natural-sounding noise to mask a disturbing noise. A pitch of all acoustic signals of which the synthetic noise is composed remains the same. Broadband noise, also described as white noise, is, in particular, used as a source for the unmodulated synthetic sound. In order to generate a particularly natural-sounding synthetic noise, the sound characteristics of the synthetic noise are adjusted so that it sounds like the rush of the wind and/or a tire rolling on a surface. It is a disadvantage, however, that the synthetically generated noise is not embedded in the acoustic behavior of the vehicle, and instead acts as a "plaster" to mask the undesirable noise. No comfortable masking of the undesirable noise is thus possible.

Exemplary embodiments of the present invention are directed to an improved method of using synthetic noises for masking undesirable disturbing noises during the operation of a vehicle, using which method the comfort of vehicle occupants during the operation of the vehicle can be improved.

In a method for masking undesirable disturbing sounds of the kind specified in the introduction, 1/f noise is used according to the invention as an output source for an unmodulated synthetic noise, and before a modulation of the unmodulated synthetic noise by the at least one filter and/or amplifier, which is dependent on the vehicle parameter, the unmodulated synthetic noise is pre-modulated by means of at least one static filter.

Using the method according to the invention, it is possible to generate a particularly natural-sounding synthetic noise to mask disturbing noises. This natural-sounding synthetic noise can be particularly comfortably embedded in an acoustic behavior of a vehicle, such that the synthetic noise is perceived by vehicle occupants and vehicle-external traffic participants as particularly natural and as part of the vehicle. On the one hand, a core idea is to use 1/f noise as an output noise for the unmodulated synthetic noise. Unmodulated in this context means that a corresponding output signal has not been manipulated. 1/f noise, also described as pink noise, is a noise which, when viewed in the frequency domain, corresponds to a linearly decreasing function. This means that the amplitude, i.e., the volume of the respective frequencies, decreases with increasing frequencies. In a double logarithmic application, 1/f noise has a negative incline of approx. 3 dB per octave. For white noise, by contrast, the amplitude of the noise is almost constant over all frequencies. For people, however, white noise sounds high-pitched. This means that high frequencies are perceived more strongly by people. Because the amplitude of the high frequencies falls for 1/f noise, however, 1/f noise is experienced as a noise in the case of which all frequency ranges of the audible sound spectrum sound approximately equally loud. This allows the generation of a particularly natural-sounding synthetic noise to mask disturbing noises.

Using the static filter, the 1/f noise is modulated such that the synthetic noise pre-modulated by means of the static filter has a peak in the frequency range in which the disturbing noise to be masked is present. This transfer function of the static filter is constant, and thus independent of any acceleration and/or speed of the vehicle or of drivetrain components of the vehicle.

1/f is a normalized standard function, and is used as the only signal source to form the unmodulated synthetic noise. This minimizes the computer power and storage space resources required to generate the synthetic noise. For example, the 1/f noise can be stored in the form of a WAV file in a storage element such as a flash storage device, and the unmodulated synthetic noise can be sampled from the WAV file.

One possible disturbing sound to be masked using the synthetic noise can, for example, be generated by a drivetrain of the vehicle. In particular, it is the drivetrain of an at least partially electric vehicle. In electric vehicles, it can be the case that, in particular, the electric part of the drivetrain generates a wailing sound having a pre-determined frequency spectrum in a particular speed range, i.e., at a particular rotational speed of a drivetrain component. This wailing sound is disturbing and should be masked. Because the generation of the wailing sound is dependent on the rotational speed of at least one component of the drivetrain, the wailing sound also arises in a very particular continued movement speed range of the vehicle. In order to particularly comfortably mask the disturbing sound, the synthetic noise is embedded into the active behavior of the vehicle such that, for example, the synthetic noise is emitted to mask the forward movement speed range of the vehicle in which the wailing tone also arises.

The aim is to adjust a volume of the synthetic noise to the volume of the disturbing noise to be drowned out. If the synthetic noise is too quiet, then the disturbing noise can still be perceived. If, on the other hand, the synthetic noise is too loud, the synthetic noise itself is, in some instances, experienced by a vehicle occupant as disturbing. By multiplying the pre-modulated synthetic noise with an amplifier, the volume of the synthetic noise can be adjusted to an intended volume in a targeted manner.

An advantageous development of the method provides that the unmodulated synthetic noise is pre-modulated by means of the at least one static filter such that the pre-modulated synthetic noise comprises at least two acoustic signals, wherein a first acoustic signal has a first spectral width, a second acoustic signal has a second spectral width, the first spectral width corresponds to a frequency range of 0 to a maximum of 2200 Hz, and the second spectral width lies in a higher frequency range than the first spectral width, wherein the second spectral width completely comprises a spectral width of at least one disturbing noise to be masked. Because the pre-modulated synthetic noise is generated such that it comprises at least the first and second acoustic signal, a natural-sounding perceptibility of the synthetic noise is improved. Due to the low-frequency portions, the synthetic noise sounds like a particularly natural wind and/or rolling sound. Comfort for the occupant of the vehicle is thus improved even further during the operation of the vehicle. The first spectral width can be any width within the frequency range of 0 to 2200 Hz. For example, the first spectral width can be a value of 0 to 500 Hz, 0 to 1500 Hz, 200 to 600 Hz or 1700 to 2200 Hz. Via the first spectral width, a sound of "background noise" of the wind or rolling noise can be adjusted in a targeted manner.

The second spectral width comprises at least the frequency range in which the disturbing noise to be masked arises. In a frequency range bordering the disturbing noise to be masked, for example ±100 Hz, the amplitude of the second acoustic signal can gradually decrease or increase. This further supports the natural sound of the synthetic noise.

Corresponding to an advantageous development of the method according to the invention, at least one adaptive filter is formed by a low-pass filter, wherein a limit frequency of the low-pass filter depends on a continued movement speed of the vehicle. Using the low-pass filter, the natural sound of the synthetic noise can be even further improved. A natural wind or rolling noise of a vehicle is thus dependent on the speed at which the vehicle is moving forward. With an increasing forward movement speed, a portion of high frequencies in the wind or rolling noise also increases. The low-pass filter is designed as an adaptive filter and is independent of the forward movement speed of the vehicle. The limit frequency of the low-pass filter is shifted to high frequencies when the forward movement speed of the vehicle increases. The pitch of the acoustic signals of the modulated synthetic noise remains constant, but the low-pass filter can be used to control the frequency up to which acoustic signals, and thus sounds, should be integrated into the modulated synthetic noise. Thus, as the forward movement speed of the vehicle increases, more sounds having higher frequencies can be recorded. The sound characteristics of the modulated synthetic noise can thus be adjusted to a particularly natural-sounding wind or rolling sound.

A further advantageous embodiment of the method according to the invention further provides that an amplification factor of at least one adaptive amplifier depends on a continued movement speed of the vehicle, wherein the amplification factor takes on a maximum value in at least one speed range in which a disturbing noise arises. As already specified, the volume of the modulated synthetic noise can be adjusted using an amplifier. The amplifying factor of the adaptive amplifier is coupled with the forward movement speed of the vehicle. In a speed range in which the disturbing noise to be masked does not arise, this amplification factor is preferably 0, or a very low value such as 0.01. In the forward movement speed range in which the disturbing noise to be masked arises, the amplification factor of the amplifier is, by contrast, in particular 1 or higher.

Corresponding to a further advantageous embodiment of the method, the amplification factor takes on a minimum value at a pre-determined spacing before the beginning and after the end of the speed range in which the disturbing noise arises, and in particular continuously increases or decreases from the minimum value to the maximum value. In other words, the volume of the modulated synthetic noise for masking the disturbing noise increases slightly as the forward movement speed of the vehicle increases, and also slightly decreases again upon leaving the speed range in which the disturbing noise is present. The synthetic noise can thus be particularly comfortably embedded into the acoustic behavior of the vehicle to mask the disturbing noise. The modulated synthetic noise can thus blend seamlessly into the wind or rolling noise which can be perceived in the vehicle interior by the vehicle occupants. Only a minimal increase of the total volume in the vehicle interior thus arises during the use of the vehicle. This increase is also only limited to the problematic speed range of the vehicle. The vehicle occupants thus experience the synthetic noise as particularly authentic. The synthetic noise particularly preferably begins to get louder 10 km/h before the disturbing noise actually arises, and also decreases back to its minimum volume again 10 km/h after the disturbing noise stops. Via this gentle integration of the synthetic noise into the acoustic behavior of the vehicle, the synthetic noise appears even more natural.

A further advantageous embodiment of the method according to the invention further provides that after the modulation by the at least one adaptive filter and/or an amplifier, preferably equipped to adjust a damping (relative volume of the returned signal), the synthetic noise experiences a feedback delay, the transfer function of which feedback delay corresponds to a comb filter. By imposing a feedback delay on the synthetic noise, a natural sound of the synthetic noise can be increased even further. Comparatively little computing complexity is required to impose the feedback delay. Furthermore, a light flanging, i.e., imposing non-linearities, can be generated in the synthetic noise. The volume of the feedback must be smaller than 0 dB, because instabilities otherwise arise. This damping volume can be adjusted in the vehicle. This makes it possible for the vehicle occupants or an authorized technician to adjust the sound of the synthetic noise depending on personal preferences. Using the feedback delay, it can be made more difficult to recognize repeating patterns. Because the human ear is able to very effectively recognize repeating patterns, the natural sound of the synthetic noise can thus be further increased. In particular, the synthetic noise experiences feedback delay several times.

Corresponding to a further advantageous embodiment of the method, a delay time inverse to a frequency of the disturbing noise to be masked is impressed onto the synthetic noise in the feedback delay. The corresponding transfer function thus has the equation deceleration time=1/frequency. The transfer function can also be adjusted such that it is multiplied with the multiple of the frequency 1/(n*f), and thus for example 1/(2×f). The multiplication factor n is ideally taken from a number range of $2^X$, where X contains positive or negative whole numbers. For example, the factor n thus ideally has values of 0.25, 0.5, 1, 2, 4 etc. The transfer function of the comb filter is thus acoustically adjusted to octaves of the disturbing frequency, which contributes to the natural impression made by the synthetic covering noise. The adjusted frequency f can also be freely adjusted in the vehicle, and only needs to be roughly based on the frequency of the disturbing noise to be covered. A variance can also be included in the formula for calculating the delay time, which is inverse to the adjusted frequency. Thus, for example, the formula can be: delay time=1/(frequency+variance) or delay time=1/(frequency−variance). Multiplication factors and variances can also be used simultaneously, and thus, for example, delay time=1/(N*frequency+/−variance). If the dominant frequency at which a disturbing noise arises lies for example in a range around 3500 Hz, the variance can thus for example be 500 Hz or fractions or multiples of the latter.

A further advantageous embodiment of the method according to the invention further provides that at least one synthetic noise to be emitted in the vehicle is distributed to at least two loudspeakers. Because the synthetic noise is distributed across at least two loudspeakers, preferably more than two loudspeakers, it is difficult for vehicle occupants to locate its source. The synthetic noise thus appears to come from different directions, which further improves the natural sound.

Corresponding to a further advantageous embodiment of the method, at least one synthetic noise is emitted via at least two loudspeakers such that a position of an apparent noise source, from which the synthetic noise appears to be coming for a vehicle occupant, is positioned in a vehicle interior at a pre-determined location, in particular while using an ambisonics algorithm. Via a slight time delay in the emission of the synthetic noise between the at least two loudspeakers, it is made possible to freely position a position of an apparent source of noise, from which the synthetic noise appears to come for a vehicle occupant, in the vehicle interior. Particularly preferably, more than two loudspeakers, for example three, four or five loudspeakers, are used for this purpose. The time delay of the emission of the synthetic sound is determined individually for each of the loudspeakers. An ambisonics algorithm is particularly preferably used for an even better application of delay times and loudspeaker output volumes. Ambisonics is a method for recording and/or playing back a sound field. Ambisonics makes it possible to place virtual, and thus apparent noise sources in space particularly easily and comfortably. A developer is thus able to pre-determine the position from which the synthetic noise appears to come relative to the vehicle. Thus, for the vehicle occupants, the synthetic noise no longer appears to come from the corresponding loudspeakers, and instead, for example, appears to come from a fictitious sound source behind a dashboard of the vehicle, from the direction of the vehicle mirror or the like. Because the vehicle occupants do not perceive the synthetic noise from the direction of the loudspeaker, and instead from any other direction, the synthetic noise appears to belong to the vehicle even more naturally.

A further advantageous embodiment of the method according to the invention further provides that at least two synthetic noises provided with a feedback delay are emitted in the vehicle, and the apparent positions of their noise sources are positioned at different locations in the vehicle interior, wherein the two synthetic noises each have a different feedback delay time. The natural sound of the synthetic noise is thus improved even further. The two synthetic sounds can also be identical with the exception of their feedback delay. The two synthetic sounds can also differ at least partially in their frequency bandwidth, however.

According to the invention, in a vehicle having a computer, at least one sensor for recording a vehicle speed and at least one loudspeaker, the computer, the sensor, and the loudspeaker are equipped to carry out a method described above. The vehicle can be any vehicle, e.g., a passenger car, HGV, transporter, bus, or the like. The computer comprises hardware and software for implementing the method according to the invention. The computer thus comprises at least one storage element, for example a flash storage device, to store a sound file used to form the 1/f noise and/or program code which, if run on a processor, allows the method according to the invention to be carried out. Individual signal processing elements, such as filters and/or amplifiers, can be designed as hardware components and/or software components. The sensor makes it possible at least to record the vehicle speed. A volume of the synthetic noise can thus be adjusted depending on the vehicle speed, such that the synthetic noise is emitted at a sufficient volume exactly when the disturbing noise to be masked also arises. The synthetic noise for masking at least one disturbing noise is emitted via at least one loudspeaker, preferably via several loudspeakers. The loudspeakers can be arranged in any manner in the vehicle.

Several disturbing noises can also arise during the operation of the vehicle, wherein in particular the different disturbing noises arise at different forward movement speeds of the vehicle. Using the method according to the invention, all the disturbing noises which arise can be masked individually. Different synthetic noises are correspondingly generated using the method according to the invention.

Particularly preferably, the vehicle has an at least partially electrified drivetrain. The vehicle is thus designed as a hybrid vehicle or as a vehicle driven purely by electric battery. In particular, in an electric drivetrain, wailing sounds arise at various operating points, which wailing sounds can be particularly comfortably masked using the method according to the invention.

Further advantageous embodiments of the method according to the invention for masking undesirable disturbing noises and of the vehicle also result from the exemplary embodiments, which are described in more detail in the following with reference to the figures.

BRIEF DESCRIPTION OF THE DRAWING FIGURES

Figure 2:
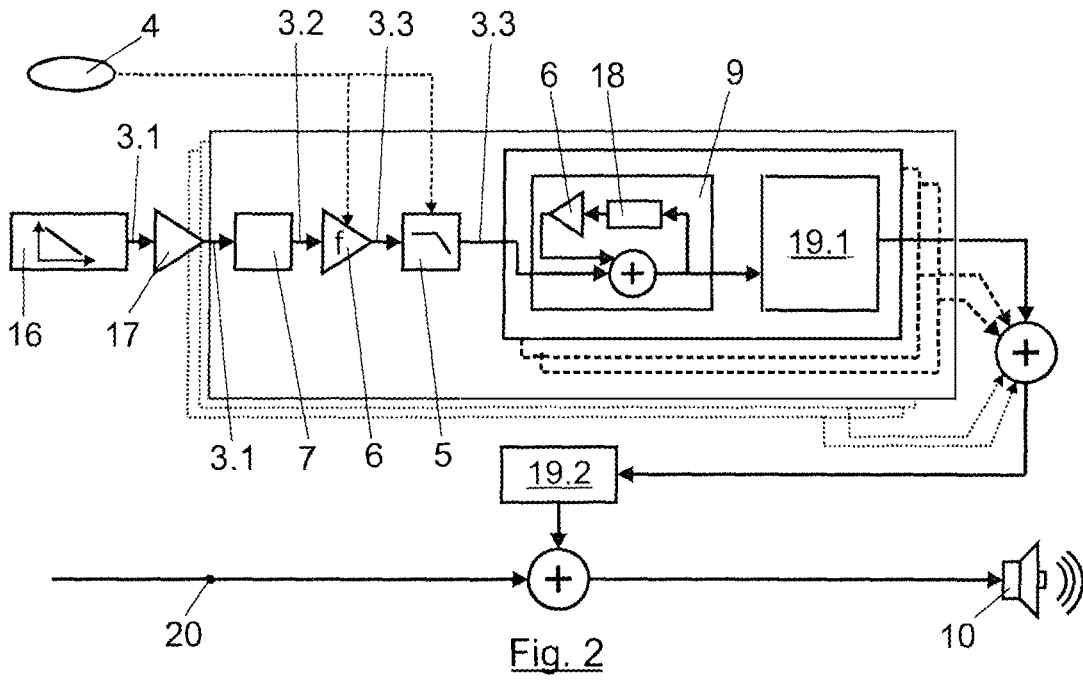

Here:

FIGS. 1a)-1d) show a depiction in principle of several diagrams of noises arising during the operation of a vehicle in a frequency domain;

FIG. 2 shows a schematic diagram depicting processing according to the invention of a synthetic noise; and

US 12,573,363 B2

Figure 3:
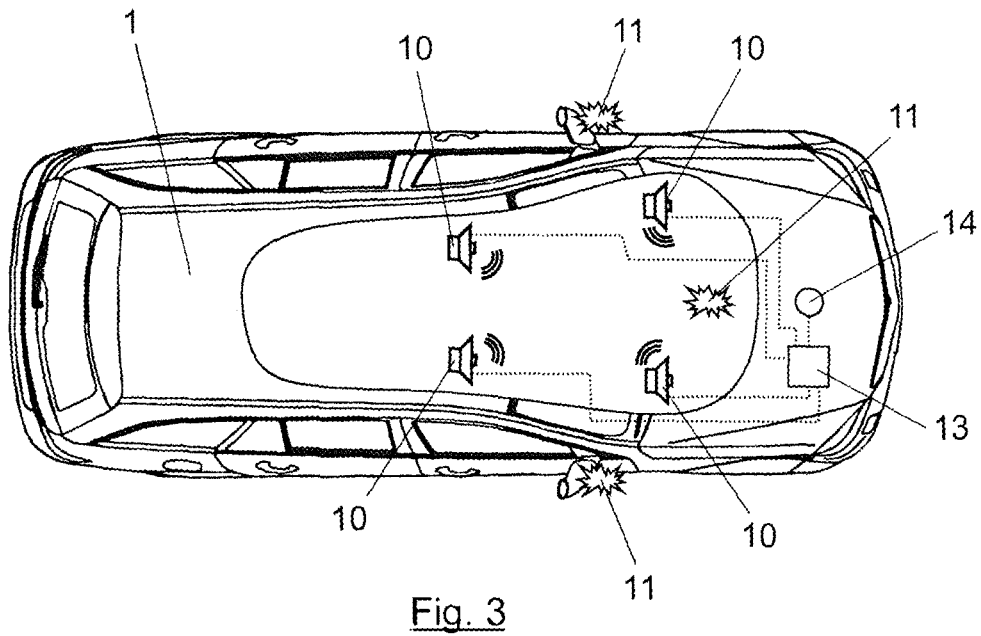

FIG. 3 shows an aerial view of a vehicle according to the invention, in which disturbing noises arising in operation are masked using the method according to the invention.

DETAILED DESCRIPTION

FIGS. 1a)-1d) show four different acoustic diagrams, in which a volume PEGEL of different noises is plotted over a frequency F. FIG. 1a) shows a disturbing noise 2 arising at a particular operating point during the operation of a vehicle 1 shown in FIG. 3, and a background noise 15 which is present during operation. The disturbing noise 2 becomes perceptibly apparent in a vehicle interior 12, also shown in FIG. 3, if the vehicle 1 moves forward at a forward movement speed lying in a particular speed range, for example between 110 km/h-120 km/h. The disturbing noise 2 has a comparatively narrow spectral width SB, and thus comprises just a few acoustic signals each with a respective characteristic frequency F, and can thus be experienced as a disturbing "wailing sound". The disturbing noise 2 is, in particular, emitted by an electric part of a drivetrain of the vehicle 1.

In order to improve a comfort of vehicle occupants during the operation of the vehicle 1, a synthetic noise 3 shown in FIG. 1b) is generated using a method according to the invention to mask the disturbing noise 2. The synthetic noise 3 is characterized by a particularly natural sound, and is thus embedded into an acoustic behavior of the vehicle 1, such that the synthetic noise 3 does not stick out in the operation of the vehicle 1 as a "plaster" to drown out the disturbing noise 2, and instead blends seamlessly into the soundscape which can be perceived in the vehicle interior 12. In particular, the synthetic noise 3 sounds like the wind and/or the noise of a tire rolling on a road. The synthetic noise 3 has a maximum volume value at the spectral width SB of the disturbing noise 2, which can be seen in FIG. 1b) by a peak. In FIG. 1b), the maximum volume has a comparatively large spacing a between the synthetic noise 3 and the disturbing noise 2, which causes the synthetic noise 3 to be too quiet to sufficiently mask the disturbing noise 2.

Particularly preferably, the synthetic noise 3 comprises at least two acoustic signals 8.1 and 8.2. The first acoustic signal 8.1 lies in the low-frequency range, and serves to form a particularly natural-sounding background noise. For this purpose, the first acoustic signal 8.1 has a comparatively large first spectral width SB1. The second acoustic signal 8.2 serves to mask the disturbing noise 2, and correspondingly has a second spectral width SB2, which is adjusted to the spectral width SB of the disturbing noise 2.

In FIG. 1c), the volume PEGEL of the synthetic noise 3 has been raised, whereby the spacing a has decreased. Optimal masking of the disturbing noise 2 is thus achieved from a comfort perspective.

In FIG. 1d), on the other hand, the volume PEGEL of the synthetic noise 3 has been raised too significantly. Due to this over-compensation, the risk then arises that the synthetic noise 3 itself may be experienced in turn in the vehicle interior 12 as not belonging to the natural soundscape of the vehicle 1, and thus as disturbing.

For an optimal masking, the volume PEGEL of the synthetic noise 3 should thus be significantly high, but not too loud. A volume PEGEL lying just below the volume PEGEL of the disturbing noise 2 is already sufficient to achieve an optimal psychoacoustic volume difference between the disturbing noise 2 and the synthetic noise 3.

FIG. 2 serves to depict how the synthetic noise 3 is generated. An acoustic signal 8 in the form of 1/f noise, also described as pink noise, is thus provided by a signal source 16. The signal source 16 can, for example, comprise the 1/f noise as a WAV file, whereupon an unmodulated synthetic noise 3.1 is generated by sampling. The unmodulated synthetic noise 3.1 can optionally be changed in its volume with a static amplifier 17 after it is generated.

The unmodulated synthetic noise 3.1 is then multiplied with a static filter 7. The static filter 7 can be designed as any signal filter or comprise any combination thereof. For example, the static filter 7 is a low-pass filter, high-pass filter, band-pass filter, comb filter or a combination thereof. By means of the static filter 7, the unmodulated synthetic noise 3.1 is pre-modulated, and transformed into a pre-modulated synthetic noise 3.2, in order to impress at least the peak in the spectral width SB in which the disturbing noise 2 arises on the synthetic noise 3. Because the spectral width SB of the disturbing noise 2 does not change, or changes only minimally during the operation of the vehicle 1, a static filter 7 is already sufficient to impress the peak. The frequencies comprised by the disturbing noise 2 can for example be determined in the development of the vehicle 1 using acoustic measurements, and correspondingly adjust the static filter 7.

Preferably, the synthetic noise 3 is pre-modulated such that in addition to the peak at the frequencies of the disturbing noise 2, it also comprises a lower-frequency part, and thus comprises the first acoustic signal 8.1 in addition to the second acoustic signal 8.2. Using acoustic signals in the low-frequency range, for example in a range of 0 to 2200 Hz, the natural sound of the synthetic noise 3 is improved. It can thus be achieved that noise emitted in the vehicle interior 12 sounds more like a natural wind and/or rolling noise.

The unmodulated synthetic noise 3.1 can also be distributed across several signal paths, wherein a different static filter 7 is assigned to each signal path (not depicted). The individual signals are then combined again.

Following the static filter 7, the pre-modulated synthetic noise 3.2 is multiplied with at least one adaptive amplifier 6 and/or at least one adaptive filter 5, and is thus transformed into a modulated synthetic noise 3.3. An amplification factor f of the adaptive amplifier 6 is dependent on a vehicle parameter 4. The vehicle parameter 4 is a parameter which is dependent on a forward movement speed of the vehicle 1. For example, the vehicle parameter 4 can be a rotational speed of a tire, of a shaft or the like, or the forward movement speed itself.

Using the adaptive amplifier 6, an emission of the synthetic noise 3 in the vehicle interior 12 is controlled such that the synthetic noise 3 is emitted only in the speed range in which the disturbing noise 2 also arises, plus/minus a certain speed transition range. In the speed range in which the disturbing noise 2 arises, and thus for example in the range between 100 km/h and 120 km/h, the synthetic noise 3 thus also has its maximum volume. In the speed transition range, for example +/−5 km/h, 10 km/h, 20 km/h or the like, over or under 110 km/h or 120 km/h, the volume of the synthetic noise 3 is then gradually increased or decreased. The increase and decrease of the volume of the synthetic noise 3 is implemented such that the synthetic noise 3 appears particularly natural for the vehicle occupants, and as part of the acoustic behavior of the vehicle 1. For example, the volume of the synthetic noise is increased or decreased in a linear manner or in the form of a parabola in the speed transition range.

The pre-modulated synthetic noise 3.2 or the synthetic noise 3.3 already modulated by the adaptive amplifier 6 can further be multiplied with an adaptive filter 5. Similarly to the static filter 7, the adaptive filter 5 can be any combination of typical signal filters. Particularly preferably, the adaptive filter 5 comprises at least one low-pass filter. The adaptive filter 5 is also dependent on the vehicle parameter 4. For example, the limit frequency of the low-pass filter is selected depending on the forward movement speed of the vehicle 1. The limit frequency is particularly preferably adjusted in proportion with the forward movement speed. Thus, if the vehicle 1 is driving faster, more high-frequency parts are also integrated into the modulated synthetic noise 3.3. The pitch of the individual acoustic signals of the synthetic noise 3 remains constant during the operation of the vehicle 1. More or fewer signals from the high-frequency range are simply blended into the synthetic noise 3. It is thus accounted for that as the forward movement speed of the vehicle 1 increases, a natural-sounding wind or rolling noise also comprises more high-frequency parts. The natural sound of the synthetic noise 3 can thus be improved even further.

A feedback delay is then applied to the modulated synthetic noise 3.3 via a feedback delay module 9. A delay time can be adjusted by means of a delay block 18. Particularly preferably, the delay time is the inverse of a particularly dominant frequency F of the disturbing noise 2. To avoid instabilities, the volume of the feedback should be lower than 0 dB. For this purpose, a multiplication is implemented with an amplifier 6 of which the amplification factor f has a value lower than −0.01 dB. This value can be freely adjusted in the vehicle 1.

The synthetic noise 3 can also be fed through the feedback delay multiple times. A transfer function of the feedback delay can also be similar to a comb filter or be designed as the latter.

In a particularly preferred embodiment, at least one synthetic noise 3 is emitted in the vehicle interior 12 via at least two loudspeakers 10 shown in FIG. 3. A virtual sound object is generated from the synthetic noise(s) 3, which can be placed at any location in the vehicle interior 12 or outside of the vehicle 1. The synthetic noise(s) 3 thus no longer appear to come directly from the loudspeakers 10, and instead from a position of one or more apparent noise sources 11. An ambisonics algorithm is preferably used to generate the virtual sound object and freely place the sound object in space. For this purpose, the modulated synthetic noise 3.3 is preferably processed by an ambisonics encoder 19.1, and then by an ambisonics decoder 19.2.

To generate several noises to be emitted in the vehicle interior 12, the combination of the feedback delay module 9 and the ambisonics encoder 19.1 can also be provided multiple times, as depicted by the dashed boxes. If several disturbing noises 2 exist, several synthetic noises 3 can also be generated to mask the disturbing noises 2, which is indicated by the dotted boxes. To emit the individual synthetic noises 3 in the vehicle interior 12, the individual synthetic noises 3 are then combined.

The vehicle 1 can have further devices (not explained in more detail) for generating artificial noises. Thus, for example, an artificial motor noise 20 is combined with the synthetic noises 3 to be emitted in the vehicle interior 12.

FIG. 3 shows an aerial view of a vehicle 1 according to the invention. The vehicle 1 preferably has an at least partially electrified drivetrain. In the vehicle interior 12, several loudspeakers 10 are arranged to emit at least one synthetic noise 3. Particularly preferably, at least one loudspeaker 10 is located in front of a vehicle occupant in the direction of travel of the vehicle 1, and at least one loudspeaker 10 is located behind the respective vehicle occupant. A particularly natural-sounding soundscape can thus be generated. Particularly preferably, a position of an apparent noise source 11, from which the synthetic noise 3 appears to be coming, is placed in the vehicle interior 12 at an intended position. This allows the noise source 11 to be placed freely, such that an even more natural sound experience is made possible when the synthetic noise 3 is played back. For example, one synthetic noise 3 is placed near the external mirrors of the vehicle and one synthetic noise 3 is located behind a dashboard of the vehicle 1.

To record the forward movement speed of the vehicle 1 or a value representative of the forward movement speed, the vehicle 1 comprises at least one sensor 14. The synthetic noise 3 is generated by means of a computer 13. A measured value generated by the sensor 14 is fed to the computer 13 as an input variable to control the volume of the synthetic noise 3 depending on the forward movement speed of the vehicle 1 and/or to integrate more high-frequency parts into the synthetic noise 3 as the forward movement speed increases.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

The invention claimed is:

1. A method comprising:
   masking undesirable disturbing noises arising during operation of a vehicle by emitting modulated synthetic noise,
   wherein the modulated synthetic noise is generated from an unmodulated synthetic noise to adjust a desired sound characteristic by multiplication, dependent on a vehicle parameter, with at least one filter or amplifier, wherein a pitch of all acoustic signals of which the modulated synthetic noise is composed is kept constant during the emission of the modulated synthetic noise,
   wherein the unmodulated synthetic noise is 1/f noise and is pre-modulated by at least one static filter before being modulated by the at least one filter or amplifier, and
   wherein the unmodulated synthetic noise is pre-modulated by the at least one static filter such that the pre-modulated synthetic noise comprises at least first and second acoustic signals, wherein the first acoustic signal has a first spectral width, the second acoustic signal has a second spectral width, the first spectral width corresponds to a frequency range of 0 to a maximum of 2200 Hz, and the second spectral width lies in a higher frequency range than the first spectral width, wherein the second spectral width completely comprises a spectral width of at least one disturbing noise to be masked.

2. The method of claim 1, wherein the at least one filter is at least one adaptive filter that is a low-pass filter, wherein a limit frequency of the low-pass filter depends on a continued movement speed of the vehicle.

3. The method of claim 1, wherein an amplification factor of at least one adaptive amplifier depends on a continued movement speed of the vehicle, wherein the amplification factor takes on a maximum value in at least one speed range in which a disturbing noise occurs.

4. The method of claim 3, wherein the amplification factor takes on a minimum value at a pre-determined spacing before beginning and after an end of the speed range in which the disturbing noise arises, and continuously increases and decreases from the minimum value to the maximum value.

5. The method of claim 1, wherein, after the modulation by the at least filter or amplifier with an adjustable damping, a feedback delay is introduced into the modulated synthetic noise, wherein the feedback delay is a transfer function corresponding to a comb filter, and wherein the filter is an adaptive filter.

6. The method of claim 5, wherein a delay time inverse to a frequency of the disturbing noise to be masked is imposed on the modulated synthetic noise in the feedback delay.

7. The method of claim 1, wherein the emission of the modulated synthetic noise involves emitting the modulated synthetic noise in the vehicle using at least two loudspeakers.

8. The method of claim 7, wherein the modulated synthetic noise is emitted via the at least two loudspeakers such that a position of an apparent noise source, from which the modulated synthetic noise appears to be coming for a vehicle occupant, is positioned in a vehicle interior at a pre-determined location.

9. The method of claim 8, wherein the emission of the modulated synthetic noise further comprises emitting a further modulated synthetic noise, wherein the modulated synthetic noise and the further modulated synthetic noise are emitted in the vehicle with a feedback delay are emitted in the vehicle, and wherein apparent positions of modulated synthetic noise and the further modulated synthetic noise are positioned at different locations in the vehicle interior, wherein the modulated synthetic noise and the further modulated synthetic noise each have a different feedback delay time.

10. A vehicle, comprising:

a computer;

at least one sensor coupled to the computer and configured to record a speed of the vehicle; and at least one loudspeaker coupled to the computer, wherein the computer and the loudspeaker are configured to mask undesirable disturbing noises arising during operation of a vehicle by emitting modulated synthetic noise, wherein the modulated synthetic noise is generated from an unmodulated synthetic noise to adjust a desired sound characteristic by multiplication, dependent on at least the recorded speed of the vehicle, with at least one filter or amplifier, wherein a pitch of all acoustic signals of which the modulated synthetic noise is composed is kept constant during the emission of the modulated synthetic noise, wherein the unmodulated synthetic noise is 1/f noise and is pre-modulated by at least one static filter before being modulated by the at least one filter or amplifier, and wherein the unmodulated synthetic noise is pre-modulated by the at least one static filter such that the pre-modulated synthetic noise comprises at least first and second acoustic signals, wherein the first acoustic signal has a first spectral width, the second acoustic signal has a second spectral width, the first spectral width corresponds to a frequency range of 0 to a maximum of 2200 Hz, and the second spectral width lies in a higher frequency range than the first spectral width, wherein the second spectral width completely comprises a spectral width of at least one disturbing noise to be masked.

11. The vehicle of claim 10, wherein the at least one filter is at least one adaptive filter that is a low-pass filter, wherein a limit frequency of the low-pass filter depends on a continued movement speed of the vehicle.

12. The vehicle of claim 10, wherein an amplification factor of at least one adaptive amplifier depends on a continued movement speed of the vehicle, wherein the amplification factor takes on a maximum value in at least one speed range in which a disturbing noise occurs.

13. The vehicle of claim 12, wherein the amplification factor takes on a minimum value at a pre-determined spacing before beginning and after an end of the speed range in which the disturbing noise arises, and continuously increases and decreases from the minimum value to the maximum value.

14. The vehicle of claim 10, wherein, after the modulation by the at least one filter or amplifier with an adjustable damping, a feedback delay is introduced into the modulated synthetic noise, wherein the feedback delay is a transfer function corresponding to a comb filter, wherein the filter is an adaptive filter.

15. The vehicle of claim 14, wherein a delay time inverse to a frequency of the disturbing noise to be masked is imposed on the modulated synthetic noise in the feedback delay.

16. The vehicle of claim 10, wherein the emission of the modulated synthetic noise involves emitting the modulated synthetic noise in the vehicle using at least two loudspeakers.

17. The vehicle of claim 16, wherein the modulated synthetic noise is emitted via the at least two loudspeakers such that a position of an apparent noise source, from which the modulated synthetic noise appears to be coming for a vehicle occupant, is positioned in a vehicle interior at a pre-determined location.

18. The vehicle of claim 17, wherein the emission of the modulated synthetic noise further comprises emitting a further modulated synthetic noise, wherein the modulated synthetic noise and the further modulated synthetic noise are emitted in the vehicle with a feedback delay are emitted in the vehicle, and wherein apparent positions of modulated synthetic noise and the further modulated synthetic noise are positioned at different locations in the vehicle interior, wherein the modulated synthetic noise and the further modulated synthetic noise each have a different feedback delay time.

* * * * *